(12) United States Patent
Jeon et al.

(10) Patent No.: US 7,003,265 B2
(45) Date of Patent: Feb. 21, 2006

(54) SYSTEM AND METHOD FOR FILTERING SIGNALS IN A TRANSCEIVER

(75) Inventors: Young-Deuk Jeon, Seoul (KR); Seung-Wook Lee, Seoul (KR); Jeong-Woo Lee, Seoul (KR); Joonbae Park, Seoul (KR); Kyeongho Lee, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 0 days.

(21) Appl. No.: 10/927,013

(22) Filed: Aug. 27, 2004

(65) Prior Publication Data
US 2005/0048928 A1 Mar. 3, 2005

Related U.S. Application Data

(60) Provisional application No. 60/498,366, filed on Aug. 28, 2003.

(51) Int. Cl.
*H04B 1/38* (2006.01)
(52) U.S. Cl. ............................ 455/73; 455/78; 333/103
(58) Field of Classification Search ............ 455/73–88; 333/103, 104
See application file for complete search history.

(56) References Cited

U.S. PATENT DOCUMENTS

| | | | | |
|---|---|---|---|---|
| 5,521,561 A | * | 5/1996 | Yrjola et al. | ................ 333/103 |
| 2003/0078011 A1 | * | 4/2003 | Cheng et al. | ................. 455/73 |

* cited by examiner

*Primary Examiner*—Lee Nguyen
(74) *Attorney, Agent, or Firm*—Fleshner & Kim, LLP

(57) ABSTRACT

A system and method for filtering signals in a communications system reduces hardware and chip size requirements by selectively connecting a filter along transmitter and receiver paths of a transceiver. In operation, a controller generated signals for connecting the filter along the transmitter path when the transceiver is in transmitter mode and for connecting the filter along the receiver path when the transmitter is in receiver mode. The controller then generates additional signals for setting one or more parameters of the filter based on the path connected, or put differently based on the operational mode of the transceiver. In a variation, the controller sets the parameters of additional elements coupled to the filter as a way of further controlling processing of the transmitter and receiver signals. The system and method are particularly well suited to controlling the filtering of signals at the front-end of the transceiver having a direct-conversion architecture and in general ones performing time-multiplexing applications.

31 Claims, 12 Drawing Sheets

3rd ORDER LOW PASS CHEBYSHEV I

SYSTEM AND METHOD FOR FILTERING SIGNALS IN A TRANSCEIVER

This application claims priority to Provisional Appln. No.(s) 60/498,366 filed on Aug. 28, 2003, whose entire disclosure is incorporated herein by reference.

BACKGROUND OF THE INVENTION

1. Field of the Invention

This invention generally relates to processing signals, and more particularly to a system and method for filtering signals in a transceiver of a communications system.

2. Description of the Related Art

A transceiver is an integrated device which transmits and receives signals in a communications system. Transceivers generally operate in one of two modes. If the transceiver is unable to receive signals while transmitting, it is said to operate in half-duplex mode. If the transceiver is able to receive signals while transmitting, it is said to operate in full-duplex mode. Full-duplex mode transceivers make up the predominant share of all RF transceivers in use today, however half-duplex mode transceivers still perform many important applications.

The receiver part of a transceiver includes a front-end portion and a signal-processing portion. The front-end portion performs the function of baseband signal recovery and is important from a designer's standpoint because its noise figure and linearity determine the overall performance of the transceiver. The signal-processing portion processes the baseband signal according one of a variety of wireless standards.

The manner in which baseband signal recovery is performed may be used as a basis for classifying the receiver. If baseband recovery is performed in two steps (using two local oscillator signals), the receiver may be classified as a super-heterodyne receiver. If baseband recovery is performed in one step (using one local oscillator signal), the receiver may be classified as a homodyne receiver.

FIG. 1 shows the receiver portion of a super-heterodyne transceiver which recovers a baseband signal in two down-conversion stages. In a first down-conversion stage, a received signal is mixed with a first oscillator signal (local oscillator LO1) in mixer 1 to generate an intermediate-frequency signal. In a second down-conversion stage, the intermediate frequency signal is mixed with a second oscillator signal (LO2) in mixer 2 to generate a baseband signal, which is subsequently filtered for input into the signal-processing portion of the receiver. The oscillator signals are generated by respective phase-locked loop circuits 3 and 4, and a number of filters 5–8 and amplifiers 9 and 10 may be included to process the signal at various stages along the baseband signal recovery path. A transmitter portion of the transceiver (not shown) uses two up-conversion stages to convert a baseband signal to a predetermined carrier frequency.

FIG. 2 shows the receiver portion of a homodyne (direct-conversion) transceiver which recovers a baseband signal in one down-conversion stage. The receiver portion includes a low-noise amplifier 11, a down-converter unit 12, and two baseband circuits 13 and 14 for processing respective I and Q signals. The down-converter unit includes mixers 15 and 16 which mix the I and Q signals from the low-noise amplifier with phase-shifted versions of a local oscillator (LO) signal to thereby recover the baseband signal. Unlike a super-heterodyne receiver, the local oscillator signal is set to the frequency of the received signal (i.e., the carrier frequency). This causes the baseband signal to be recovered without the use of an intermediate frequency, hence the name "direct-conversion" receiver. The baseband circuits process the filtered I and Q signals using a number of low-pass filters 17 and 18 and variable-gain amplifiers 19 and 20. The signals output from the baseband circuits are then converted into digital signals by A/D converters 21 an 22 and input into a signal-processing portion of the receiver. A transmitter portion of the transceiver uses a single up-conversion stage to convert a baseband signal to a predetermined carrier frequency.

Super-heterodyne transceivers have drawbacks when used in multi-mode and other applications. For example, the filters located in advance of the IF mixer are typically band-pass filters having a high quality factor. It has been shown to be very difficult to achieve high accuracy and low loss using filters of this type in an integrated form. Accordingly, super-heterodyne transceivers often use passive filters along their baseband signal recovery paths. Unfortunately, these passive filters have limited flexibility for supporting many wireless standards.

The homodyne (direct-conversion) receiver is emerging as the receiver of choice among mobile system designers because it is able to perform multi-mode/multi-band applications. This type of receiver is also preferable because it can support a variety of wireless standards (e.g., 802.11b, GSM, and Bluetooth) using less hardware than a heterodyne receiver. Further, direct-conversion receivers are able to replace many of the passive filters in the heterodyne architecture with integrated low-pass filters, which, for example, may correspond to any one of a number of high-performance analog filters.

The substitution of integrated low-pass filters for passive filters may be preferable for a number of reasons. For example, while SAW and other types of passive filters demonstrate improved performance compared with integrated filters, passive filters have fixed characteristics and therefore critical parameters such as pass-band width and center frequency cannot be changed. To overcome this shortcoming, multiple passive filters must be used to support an equal number of operational bands and communication standards.

On the other hand, all the electrical characteristics of an integrated filter can be controlled and thus multi-functionality can be provided. Accordingly, when used in a multi-mode system, a single integrated filter can support multiple standards simply by changing the characteristics of the filter based on the incoming signal. Also, while performance of an integrated filter tends to be lower than a passive filter in terms of linearity and sensitivity, these performance drawbacks can be overcome by combining the integrated filter with other circuit building blocks such as a gain-controlled amplifier.

FIG. 3 shows an active RC implementation of an integrated analog low-pass filter typically used for channel selection purposes in the baseband signal recovery portion of a direct-conversion receiver. This specific implementation is a $3^{rd}$-order elliptic filter having three differential amplifiers 25–27 connected in series. The characteristics of the filter (e.g., cut-off frequency) are determined based on values selected for the variable capacitors $C_1$–$C_5$ and resistors $R_1$–$R_5$. In this implementation, the capacitors have capacitances which may be varied to change the characteristics of the filter.

While there are advantages to using integrated analog low-pass filters in performing baseband signal recovery compared to passive filters, the former type of filter has at least two drawbacks as used in conventional transceivers. First, this type of filter consumes an excessive amount of chip area, which can mostly be attributed to the size and space requirements of their capacitors and resistors. This undermines the ability to miniaturize the receiver portion of the circuit and consequently the transceiver chip in general.

Second, conventional transceivers use separate baseband filters along their transmitter and receiver paths. The receiver filter is used for channel selection and the transmitter filter is used for suppressing spurious signals from digital processing blocks such as digital-to-analog converters. Because these filters perform very different functions, it follows that they often have very different characteristics. Most of these characteristics can be controlled by adaptively tuning the filter. However, even when an adaptive-tuning scheme is employed, the filtering structure of direct-conversion and other types of transceivers is not optimal because the receiver and transmitter filters are still implemented as separate components. Using separate filters substantially increases the size of the transceiver and thus undermines miniaturization.

In view of the foregoing considerations, it is apparent that there is a need for a system and method which may be implemented to more efficiently filter signals in the transmitter and receiver portions of a communications transceiver, and which achieves this improved performance with a greater degree of integration compared with conventional circuits of this type.

SUMMARY OF THE INVENTION

An object of the present invention is to provide a system and method which filters signals in the transmitter and receiver portions of a transceiver more efficiently than conventional filter designs.

Another object of the present invention is to provide a filtering structure in a communications transceiver that is more highly integrated and thus consumes less chip space than filtering structures used in conventional communications transceivers.

Another object of the present invention is to reduce the amount of hardware required to filter signals in a communications transceiver, to thereby realize a proportional reduction in the cost of manufacture of the transceiver and any associated host system.

These and other objects and advantages of the present invention are achieved by providing a transceiver which includes a filter, a connector which selectively connects the filter to a transmitter path and a receiver path, and a controller which sets at least one parameter of the filter based on whether the filter is connected to the transmitter path or the receiver path. The connector preferably includes a switching circuit which is responsive to the output of the controller for connecting the filter to the transmitter or receiver path. Alternatively, a separate controller may be provided to control switching of the connector. The parameter which is adjusted by the controller may be one or more of a cut-off frequency, gain, group delay, and stop-band attenuation. The controller, connector, and filter are preferably included in a baseband signal recovery portion of the transceiver, which may have a down-conversion or multiple-conversion architecture. In accordance with one variation, additional circuit elements may be coupled to the filter and adjusted by the controller based on the connection path. These elements include an amplifier and another filter.

In accordance with another embodiment, the present invention provides a transceiver which includes a filter and a controller which sets at least one parameter of the filter based on a mode of operation of the transceiver. The controller sets the filter to at least a first parameter when the transceiver is operating in transmitter mode and to at least a second parameter when the transceiver is operating in receiver mode. The first and second parameters may be different cut-off frequencies. Alternatively, the adjusted parameter may be gain, group delay, or stop-band attenuation. The transceiver also includes a connector which selectively connects the filter to a transmitter path and a receiver path based on a selection signal output from the controller.

In accordance with another embodiment, the present invention provides a transceiver control system which includes a controller and a connector coupled to a filter. The connector connects the filter to one of a transmitter path and a receiver path based on a selection signal from the controller, and the same or a different controller generates the selection signal based on a mode of operation of the transceiver. The controller also sets at least one parameter of the filter based on whether the connector connects the filter to the transmitter path or the receiver path.

In accordance with another embodiment, the present invention provides a method for filtering signals in a transceiver which includes determining a mode of operation of the transceiver and setting at least one parameter of a filter based on the mode of operation. In the setting step, the filter is set to at least a first parameter when the transceiver is determined to operate in transmitter mode and is set to at least a second parameter when the transceiver is determine to operate in receiver mode. The first and second parameters may be different cut-off frequencies or different gains, group delays, or stop-band attenuations. The method further includes connecting the filter to one of a transmitter path and a receiver path based on the mode of operation. In a variation, an amplifier and/or another filter is connected to the aforementioned filter and one or more parameters of these additional elements are set based on a connection state or mode of operation of the transceiver.

In accordance with another embodiment, the present invention provides a method for controlling signal filtering in a transceiver. This method includes generating a first signal for selectively connecting a filter to a transmitter path and a receiver path and generating a second signal for setting at least one parameter of the filter based on whether the filter is connected to the transmitter path or the receiver path. The first generating step includes determining a mode of operation of the transceiver and generating the first signal based on the mode of operation. Additional signals may be generated to adjust parameters of an amplifier and/or another filter coupled to the first filter based on whether the filter is connected to the transmitter path or the receiver path. The embodiments of the present invention as described herein are suitable in a variety of transceivers, including but not limited to ones performing time-division multiplexing of signals.

Through these and other embodiments discussed below, the present invention advantageously re-uses functional building blocks to filter signals in a communications transceiver, for example, which performs time-division multiplexing. This reduces hardware requirements and makes for faster and more efficient signal processing.

DESCRIPTION OF THE PREFERRED EMBODIMENTS

The present invention is a system and method for filtering signals in a communications transceiver. Unlike other approaches, the system and method use one filter or at least a portion thereof to process signals along the transmitter and receiver paths of the transceiver. This results in a substantial increase in processing speed and efficiency, and simultaneously a reduction in the size and cost of the chip incorporating the transceiver because less hardware is being used. Also, in order to optimize performance the filter characteristics may be varied based on whether transmitter or receiver signals are being processed, however the same filter characteristics may be used for both types of signals if desired. Also, while the filter is ideally suited for use in the front-end and more specifically the baseband signal recovery portion of the transceiver, those skilled in the art can appreciate that other locations are possible including the signal processing portion or any other location in the transceiver where filtering of the transmitter and receiver signals is needed.

In all embodiments described herein, the transceiver is preferably included in a wireless terminal such as a mobile phone, personal digital assistant (PDA), or computer. However, those skilled in the art can appreciate that the invention may be adapted for use in any other type of communications system including but not limited to ones which are hardwired or optical. In this regard, it is noted that the control circuits of the invention may remain substantially the same and that only the connecting and filter portions of the system may be varied to be compatible with the type of transmission media (air, wire, light, etc.) being used, however this is not necessarily so. Also, the filter may be any type known including but not limited to analog or digital filters, low-pass, bandpass or high-pass filters, single-order or n-order filters, etc.

Figure 4:
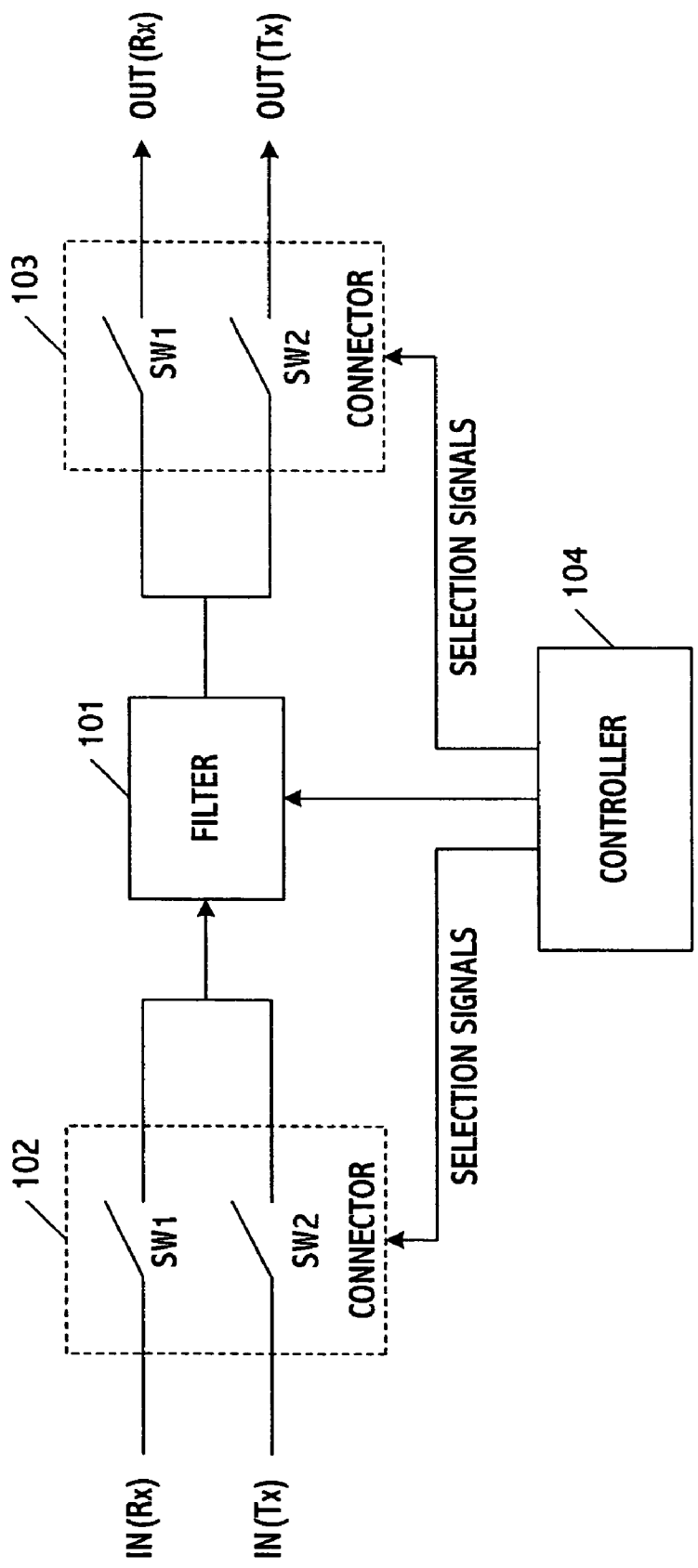
FIG. 4 is a diagram showing a system for filtering signals in a transceiver in accordance with a first embodiment of the present invention.

FIG. 4 shows a system for filtering signals in a transceiver in accordance with a first embodiment of the present invention. The system includes a filter 101, a first connector 102, a second connector 103, and a controller 104. The first connector selectively connects an input side of the filter to a signal line IN (Rx) carrying receiver signals input from an antenna (not shown) and to a signal line IN (Tx) carrying signals from a signal processing portion of the transceiver. The second connector selectively connects an output side of the filter to a signal line OUT (Rx) which, for example, may eventually carry the filtered receiver signals to a signal processing portion of the transceiver and to OUT (Tx) which may eventually carry the filtered transmitter signals to the aforementioned or another antenna. The transceiver may have a direct-conversion architecture or a super-heterodyne architecture, or even one having another type of architecture if desired.

Figure 1:
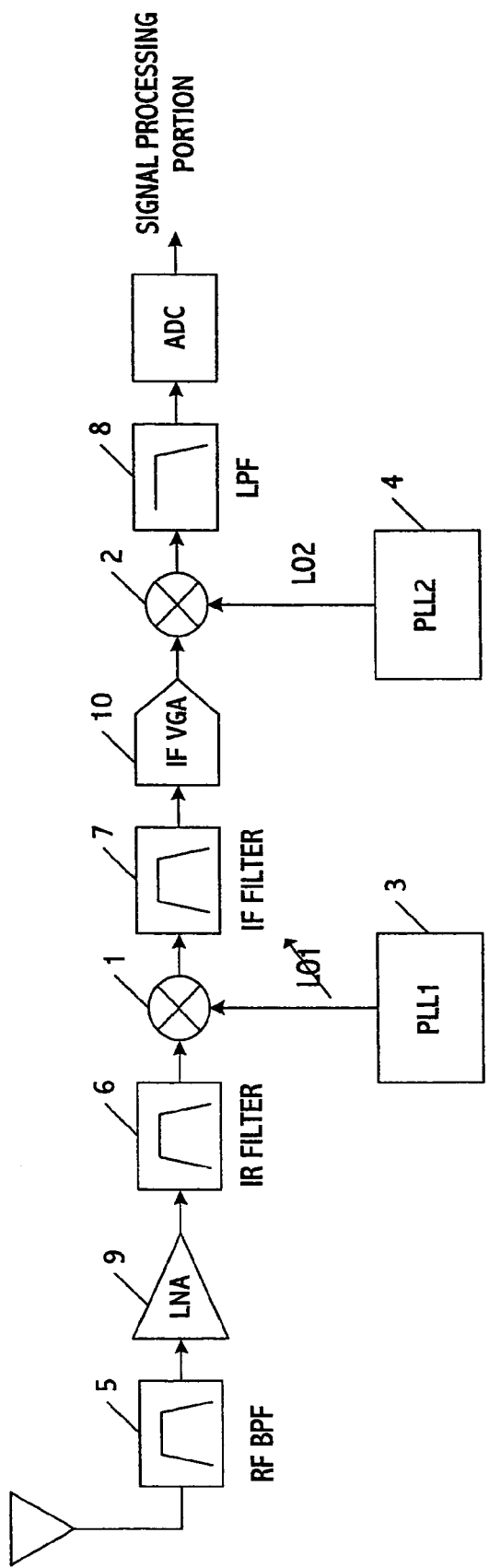
FIG. 1 is a diagram showing the receiver portion of a super-heterodyne receiver.
Figure 2:
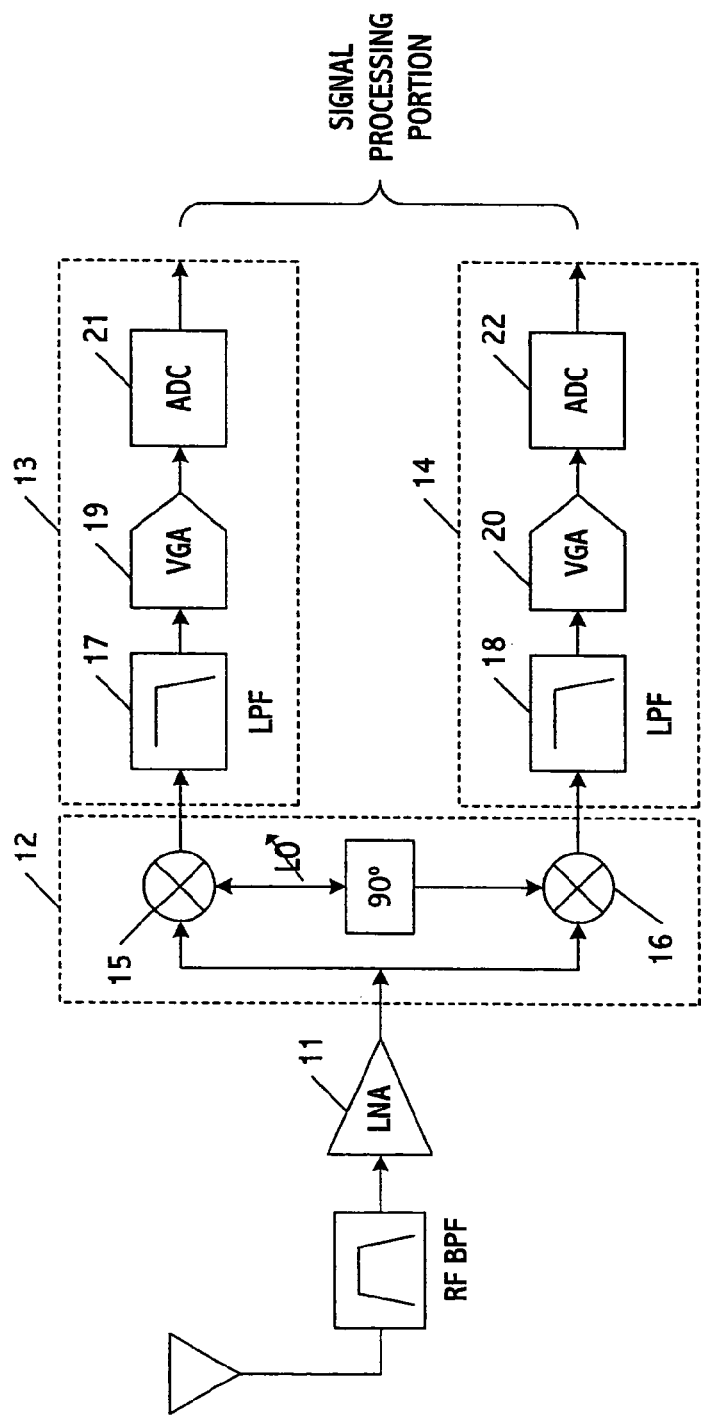
FIG. 2 is a diagram showing the receiver portion of a direct-conversion receiver.
Figure 3:
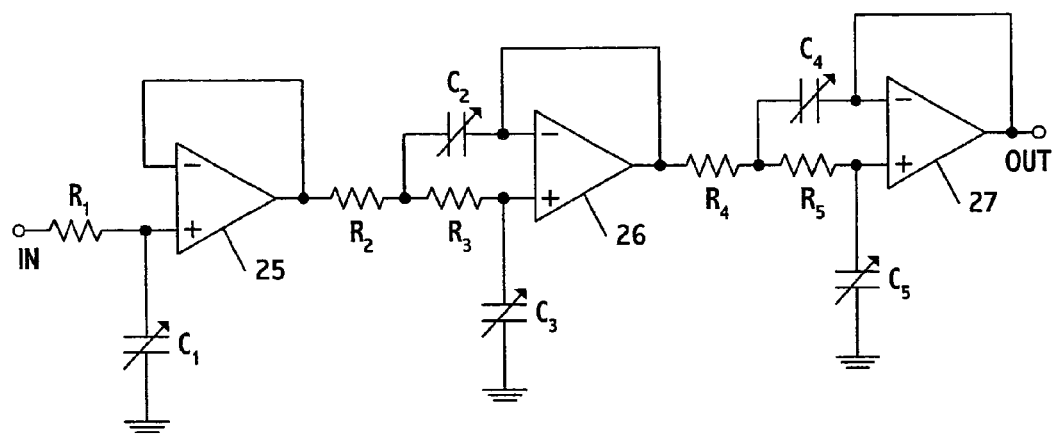
FIG. 3 is a diagram showing an active RC implementation of an integrated analog low-pass filter which may be used for channel selection in a baseband recovery portion of a direct-conversion transceiver.
Figure 5:
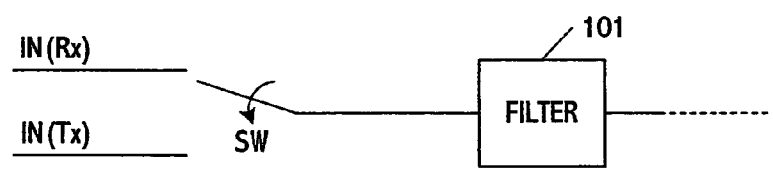
FIG. 5 is a diagram showing an alternative implementation of the connectors included in the first embodiment of the system of the present invention shown in FIG. 4.

The first and second connectors may each be formed to include one or more switches. In FIG. 4, each connector is shown as including two switches SW1 and SW2 for respectively switching receiver and transmitter signals to/from the filter. Alternatively, one or both connectors may be implemented as a one-switch configuration, as illustratively shown in FIG. 5. In this implementation, the switch SW in each connector is controlled so that the filter is connected to the receiver line in a first position and to the transmitter line in a second position. While analog switches are preferable because they do not provide any non-linearity, those skilled in the art can appreciate that the first and second connectors of the present invention may be implemented by any other selective connection.

The controller preferably generates signals for controlling the connectors and one or more parameters of the filter in a coordinated manner. These signals may be generated based on the mode of operation of the transceiver. For example, in a half-duplex transceiver the transmitter and receiver modes are alternatively performed, i.e., the transceiver does not transmit and receive signals at the same time. As a result, the transmitter filter is active when the receiver filter is inactive and vice versa. The switching of these operational modes is based on a control scheme that is well known in the art. Transceivers which perform time-multiplexed communications (e.g., 802.11b, GSM, and Bluetooth) perform in a similar manner, i.e., the transmitter and receiver portions do not function simultaneously but rather are operated at separate times.

The controller of the present invention detects or otherwise receives signals from other control portions of the transceiver as to which mode of operation is to be performed at any given time and then generates signals accordingly for controlling the connectors and filter. The detection function may be accomplished in accordance with pre-programmed features. For example, a baseband modem or host controller may be programmed to select the operating mode and then generate commands to the controller for operating the connectors and filter. In such an exemplary implementation, controller 104 may operate in a passive manner and allow operating instructions to be given by a main host controller external to the RF system. Alternatively, controller 104 may decode incoming control information to adjust one or more parameters of the filter.

The controller preferably generates two types of signals. The first type corresponds to selection signals for setting the state of the connectors based on the mode of operation of the transceiver. If the transceiver is operating in receiver mode, selection signals generated by the controller set the connectors so that the IN (Rx) and OUT (Rx) lines are connected to the filter. Conversely, if the transceiver is operating in transmitter mode, the selection signals generated by the controller set the connectors so that the IN (Tx) and OUT (Tx) lines are connected to the filter. The selection signals are preferably output either in unison or with the output line being set first in order to ensure that the filtered signals reach their destination along the proper lines and in a time-coordinated manner.

The second type of signal sets one or more parameters of the filter to ensure that its characteristics match the type of signals being processed. As previously noted, the type of filtering performed for transmitter signals may be very different from the type of filtering required for receiver signals. For example, receiver signals may be filtered for channel selection purposes, while transmitter signals may be filtered to suppress spurious signals output from a digital signal processing block (e.g., D/A converter) of the transceiver. These different filtering objectives may require different filtering characteristics. Accordingly, the controller of the present invention may generate signals for setting one or more of the following filter parameters in order to achieve the type of filtering required: cut-off frequency, gain, group delay, and stop-band attenuation. Depending upon the type of filtering to be performed, the filter may be set in one mode of operation to be, for example, a low-pass filter and in another mode of operation to a bandpass or high-pass filter. Virtually any characteristic may be produced by setting the filter values.

Figure 6:
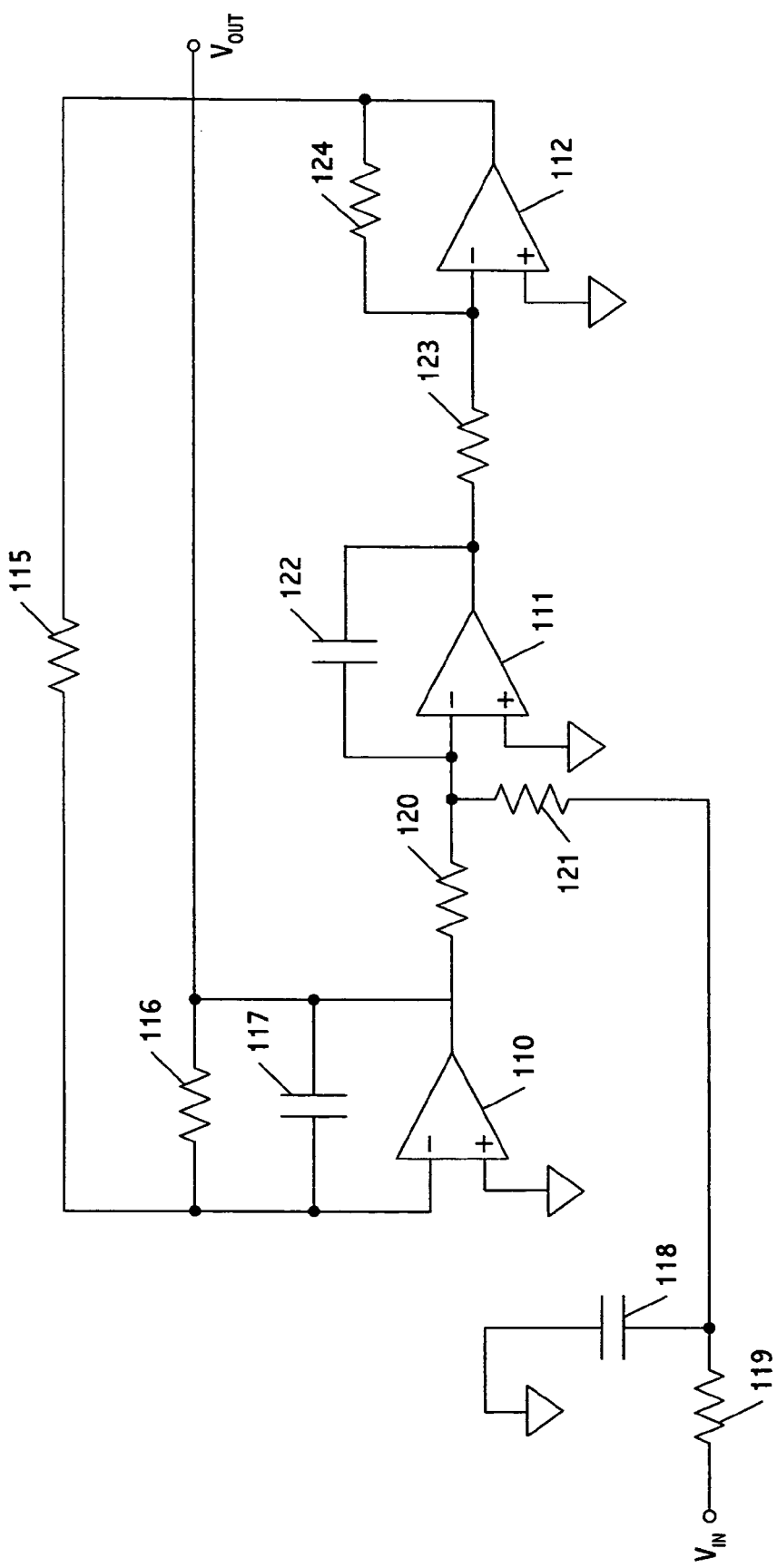
FIG. 6 is a diagram showing an example of a filter of the present invention which can be re-configured to switch between two modes of operation.

FIG. 6 shows one illustrative implementation of the filter of the present invention. The filter is in the form of a $3^{rd}$-order low-pass Chebyshev filter having input and output terminals $V_{in}$ and $V_{out}$ which are connected to connectors 102 and 103 respectively, for example, as shown in FIG. 4. The filter includes operational amplifiers 110, 111, and 112 connected in series, e.g, the output of amplifier 110 is input into the inverting terminal of amplifier 111 and the output of amplifier 11 is input into the inverting terminal of amplifier 112. The output of amplifier 112 is fed back to the inverting terminal of amplifier 110, and a resistor 115 is located along the feedback. The non-inverting terminal of each amplifier is connected to a reference potential which may be ground or another value.

Resistor 115 is connected to an arrangement formed by a resistor 116 and a capacitor 117, which are connected in parallel between the output and inverting terminal of amplifier 110. The filter also includes resistors 120 and 121 and capacitor 122 which are connected to the inverting terminal of amplifier 111, and resistors 123 and 124 connected to the inverting terminal of amplifier 112. In addition, the filter includes a capacitor 118 and resistor 119 connected to the input terminal. The resistors and capacitors in this circuit are preferably variable resistors and variable capacitors whose values may be changed based on signals supplied from controller 104, in order to achieve the desired frequency response of the filter.

Figure 7:
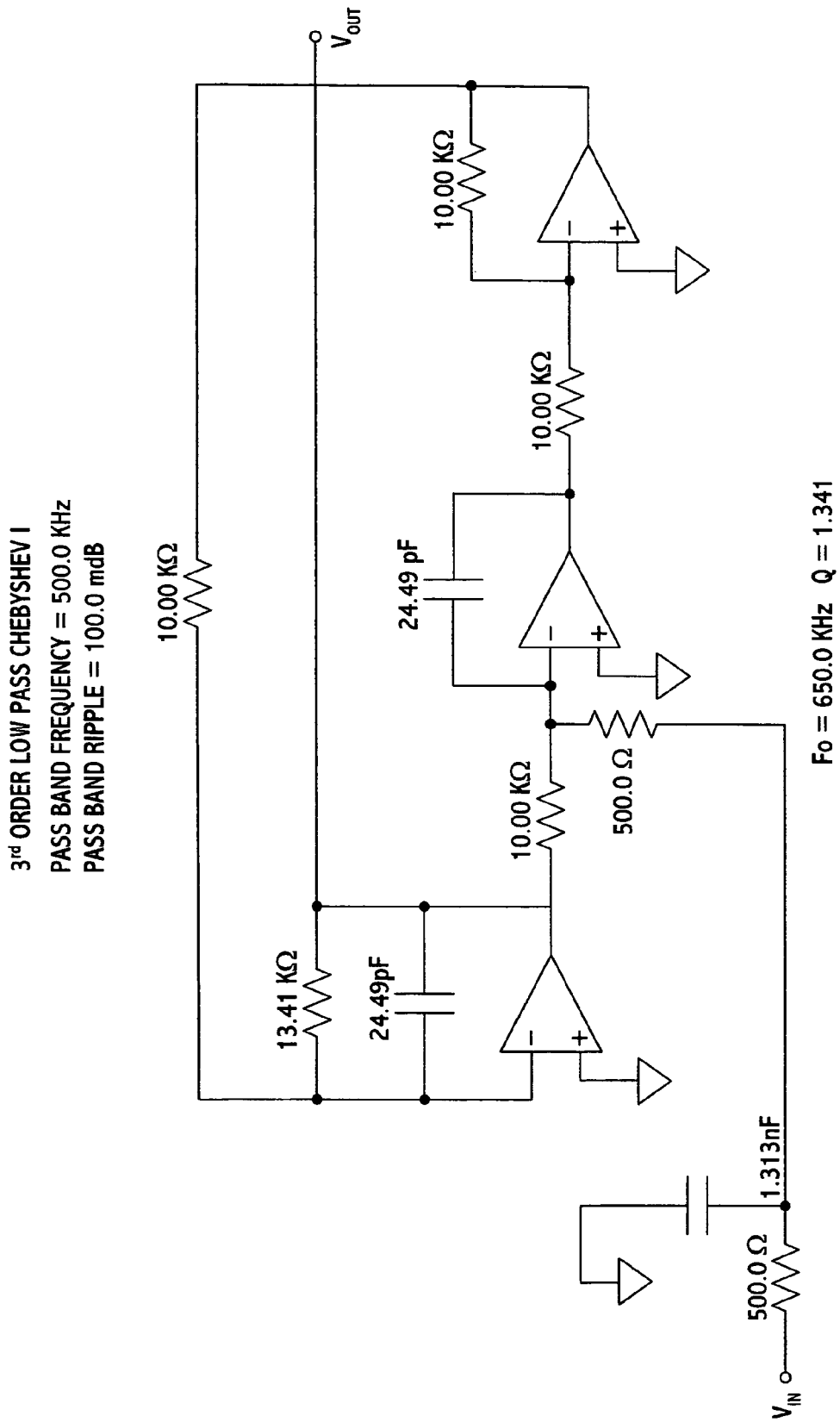
FIG. 7 is a diagram showing one way the filter of FIG. 6 may be configured for a Bluetooth application.
Figure 8:
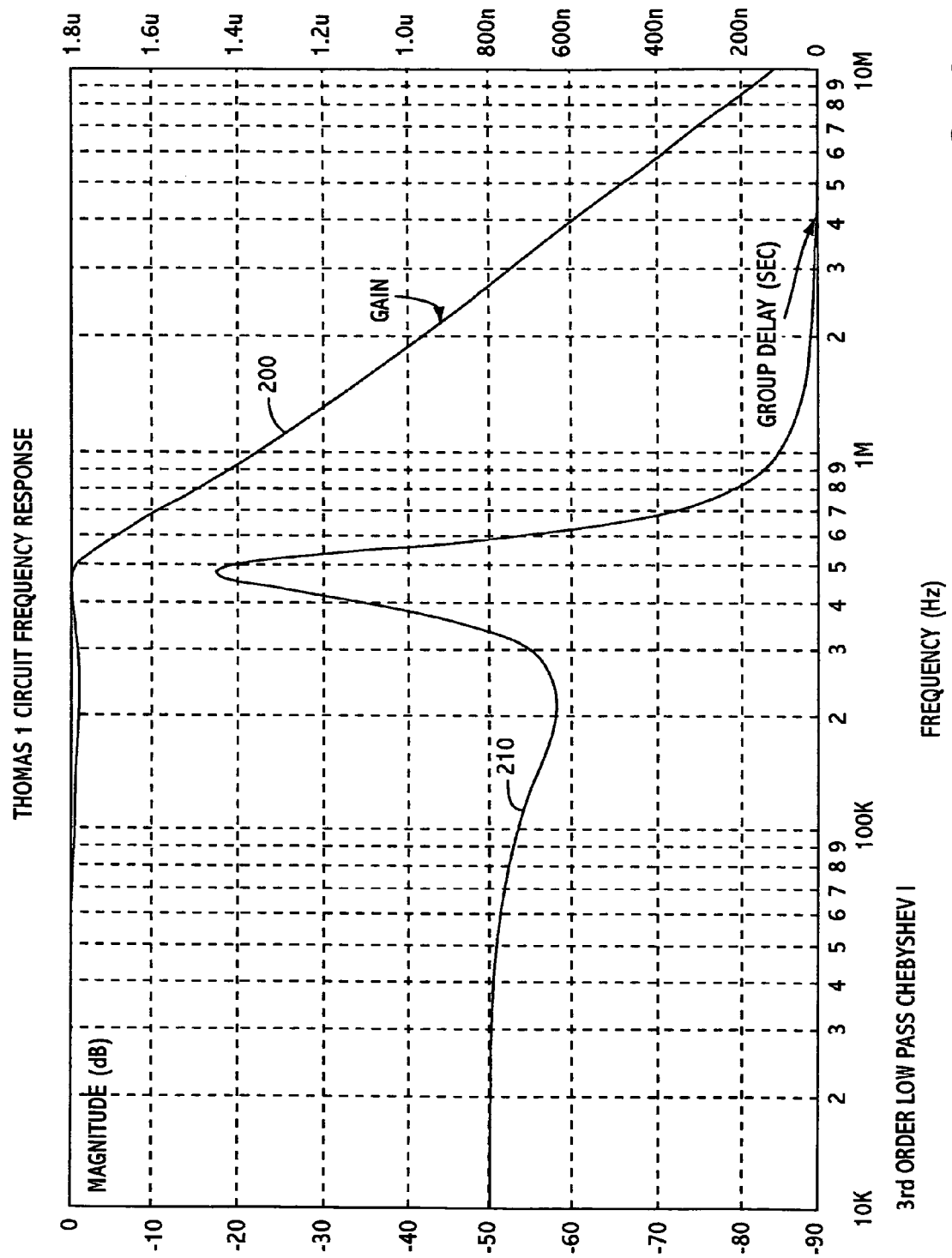
FIG. 8 is a graph showing frequency characteristics of the filter of FIG. 7.

FIG. 7 shows how the Chebyshev filter may be configured for a Bluetooth application. In this case, controller 104 sets exemplary values of the resistors and capacitors so that the filter has a pass-band frequency of 500 KHz, a pass-band ripple of 100 mdB, an output frequency $F_o$ of 650 KHz, and a Q factor of 1.341. In FIG. 8, a graph is provided to show the frequency characteristics of the filter (e.g., 500 KHz cut-off frequency). In the graph, gain curve 200 shows the manner in which out-of-band interfering signals are attenuated. The order and type of the filter may be selected to achieve this attenuation. Curve 210 shows in-band gain ripple and group delay characteristics. These are important in order to minimize impairment of the desired signal.

Figure 9:
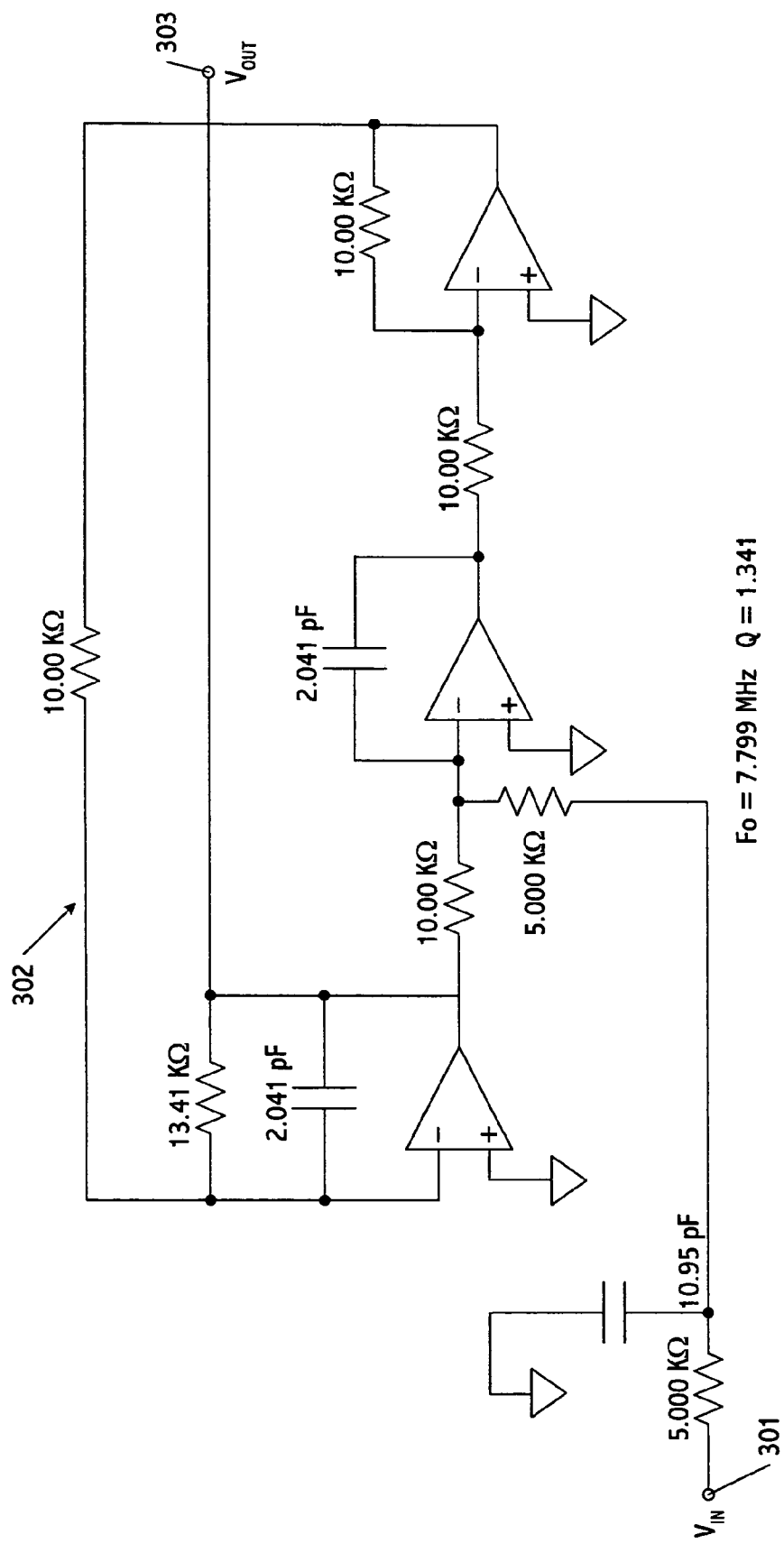
FIG. 9 is a diagram showing one way the filter of FIG. 6 may be configured for an 802.11b application.
Figure 10:
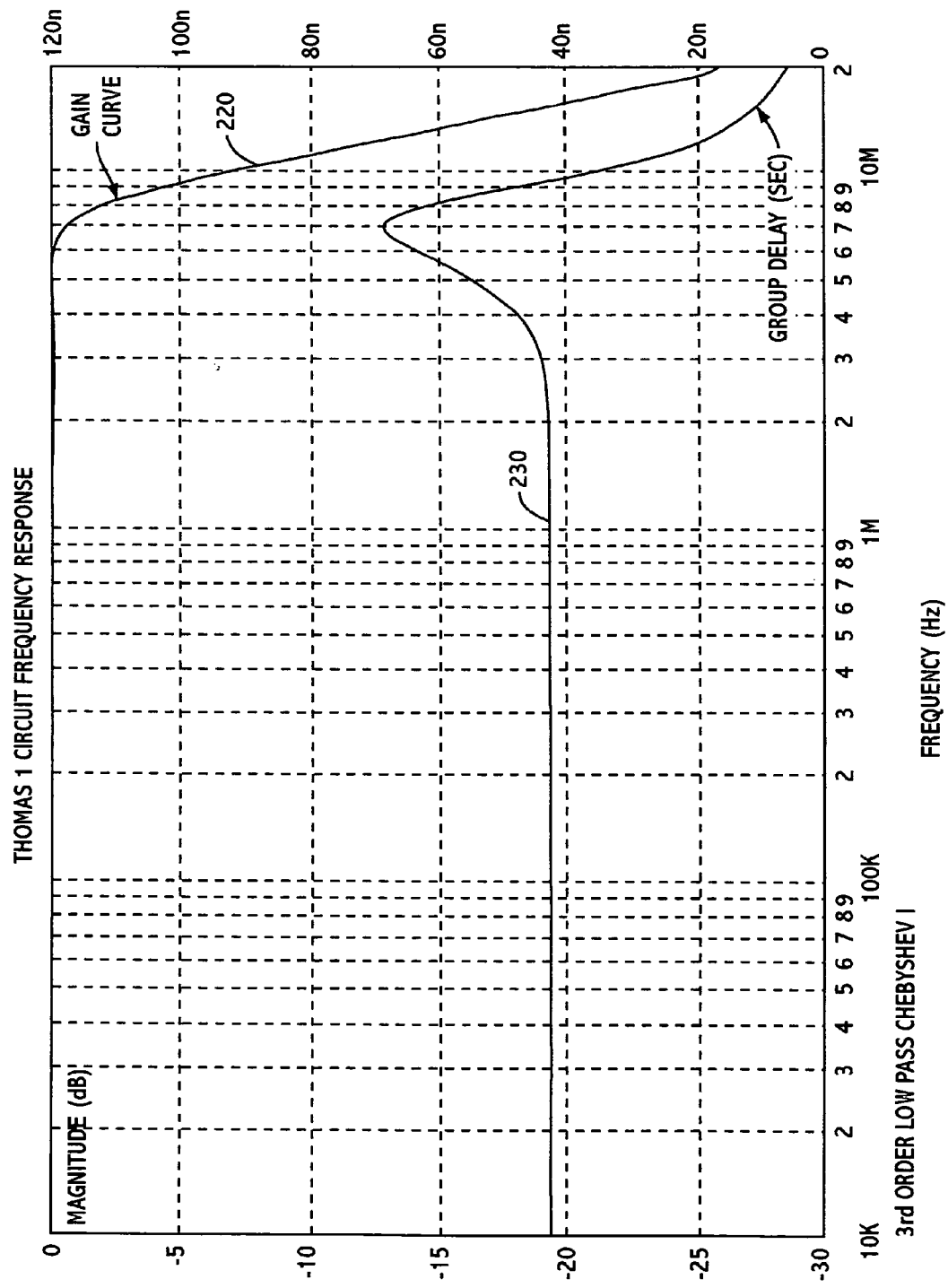
FIG. 10 is a graph showing frequency characteristics of the filter of FIG. 9.

FIG. 9 shows how the Chebyshev filter maybe configured for an 802.11b application. In this case, controller 104 sets exemplary values of the resistors and capacitors so that the filter has a pass-band frequency of 6 MHz, a pass-band ripple of 100 mdB, an output frequency $F_o$ of 7.799 MHz, and a Q factor of 1.341. In FIG. 10, a graph is provided to show the frequency characteristics of the filter (e.g., 6 MHz cut-off frequency). In the graph, gain curve 22 shows the manner in which out-of-band interfering signals are attenuated. The order and type of the filter may be selected to achieve this attenuation. Curve 23 shows in-band gain ripple and group delay characteristics. These are important in order to minimize impairment of the desired signal.

Thus, in the foregoing example, controller 104 sets the values of the filter to one of FIGS. 7 and 9 based on the application to which the filter is to be applied. This involves changing the values of resistor 119 and capacitors 117, 118, 122 as well as the reference potentials into the non-inverting terminals of the amplifiers.

While the aforementioned filter represents an advantageous application of the present invention, it is only provided for exemplary purposes. In addition to re-configuring the filter to switch between different communications protocols, the system and method of the present invention may be used to re-configure the filter to match virtually any characteristic or any signal application required.

As another example, the controller of the present invention may be implemented in a transceiver to set the filter characteristics differently depending on whether transmitter or receiver signals are being filtered. In this case, the transmitter filter characteristic may have a relatively wider cut-off frequency than the receiver filter characteristic. This is because the spurious signals to be suppressed by the transmitter filter are located far away from the desired signal. In contrast, the receiver filter characteristic has a narrow cut-off frequency in order to suppress adjacent-channel interference.

When the operational mode of the transceiver is required to change from transmitter mode to receiver mode, controller 104 generates signals for transforming the characteristic of the filter accordingly. In FIGS. 7 and 9, the transformation involved changing a plurality of circuit values. Depending on the complexity of the application, however, different numbers and/or types of circuit elements may be adjusted. For example, the adjustment may be simple, involving the setting of only one or two elements to new values in order to re-position the cut-off frequency to a desired one. In more complex schemes, the adjustment may involve setting a multiple parameters. As previously indicated, adjustment of the filter parameters is preferably performed in synchronism with the adjustments made to the connectors.

Figure 11:
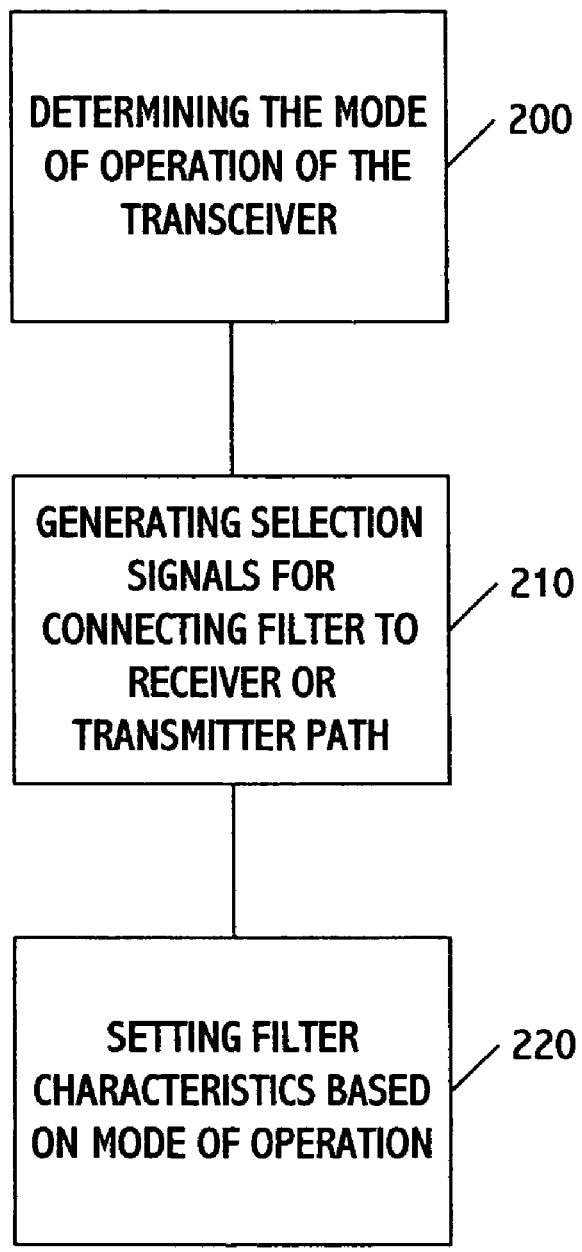
FIG. 11 is a flow diagram showing steps included in a method for filtering signals in a transceiver in accordance with one embodiment of the present invention.

FIG. 11 is a flow diagram showing steps included in a method for filtering signals in a transceiver according to a first embodiment of the present invention. For illustrative purposes, these steps are described with reference to the system shown in FIG. 4.

An initial step of the method includes determining a mode of operation of the transceiver, e.g., whether the transceiver is operating in receiver mode or transmitter mode. (Block 200). As previously mentioned, this may be performed by a detection circuit or in accordance with any one of a variety of control operating schemes employed, for example, in half-duplex transceivers.

A second step includes generating selection signals for connecting the filter along one of a transmitter path and a receiver path in accordance with the mode of operation determined in the initial step. (Block 210). Thus, for example, if the transceiver was operating in the transmitter mode and a signal has been received, the controller may generate a selection signal for connecting the filter along the receiver path of the transceiver.

A third step of the method includes generating signals for setting the characteristics of the filter based on the mode of operation determined in the initial step, or alternatively based on the connection state of the connectors. (Block 220). This step may be performed by modifying one or more of the parameters in the manner previously described. Also, it is noted that if desired the second and third steps may be performed in reverse order or simultaneously if desired.

FIG. 9 shows a system for filtering signals in accordance with a second embodiment of the present invention. This system includes a first connector 301, a processing block 302, and a second connector 303 disposed along transmitter and receiver paths. The first and second connectors may be the same or similar to the connectors in the first embodiment and the transmitter and receiver paths are identified using the same labels. The second embodiment differs from the first embodiment in respect to the configuration of the processing block and the signals generated for controlling the same.

Unlike the first embodiment, the processing block includes two filters 304 and 306 with an amplifier circuit 305 therebetween, which, for example, may be a variable-gain amplifier. The values of one or more of these elements is controlled by a tuning and control circuit 307, which may also generate the signals for controlling the switches in the first and second connectors. These values are controlled based on the mode of operation of the receiver, e.g., one or more parameters of the filters and/or amplifier may be set to different values depending on whether the transceiver is in the transmitter mode or the receiver mode and depending on the specific processing objective to be achieved in each of those modes.

While only two filters and one amplifier are shown, those skilled in the art can appreciate that different numbers of these elements may be included in the processing block and controlled in accordance with the present invention.

Figure 12A:
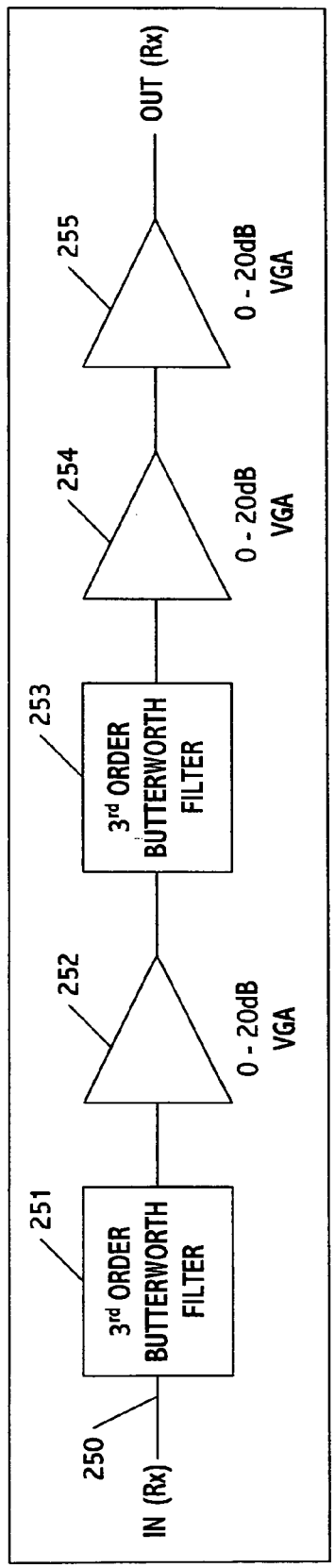
FIGS. 12(a) and 12(b) are equivalent circuit diagrams showing the receive and transmit paths of a filter in accordance with a second embodiment of the present invention.
Figure 12B:
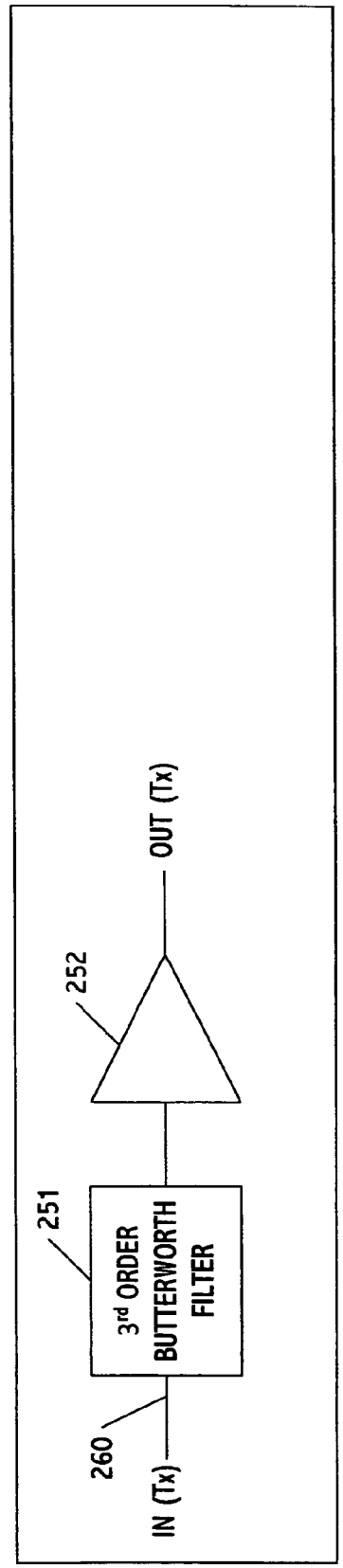

FIGS. 12(a) and 12(b) show equivalent circuit diagrams of a filter included in a transceiver sub-system according to another embodiment of the present invention. In the equivalent circuit diagrams, a receive path 250 and a transmit path 260 are shown for conceptual purposes as being separate from one another. In the receiver-mode (Rx) filter configuration, shown in FIG. 12(a), the filter includes two $3^{rd}$-order Butterworth filters 251 and 253 and three variable-gain amplifiers 252, 254, and 255, each of which may have an exemplary gain control range of 0 to 20 dB. In the transmitter-mode (Tx) filter configuration, shown in FIG. 12(b), the filter includes the $3^{rd}$-order Butterworth filter 251 and the variable-gain amplifier 252, with the other filters and amplifiers mentioned above deactivated or bypassed during transmit mode. The bypass of these elements may be achieved, for example, by a switching function in accordance with the present invention.

Figure 13:
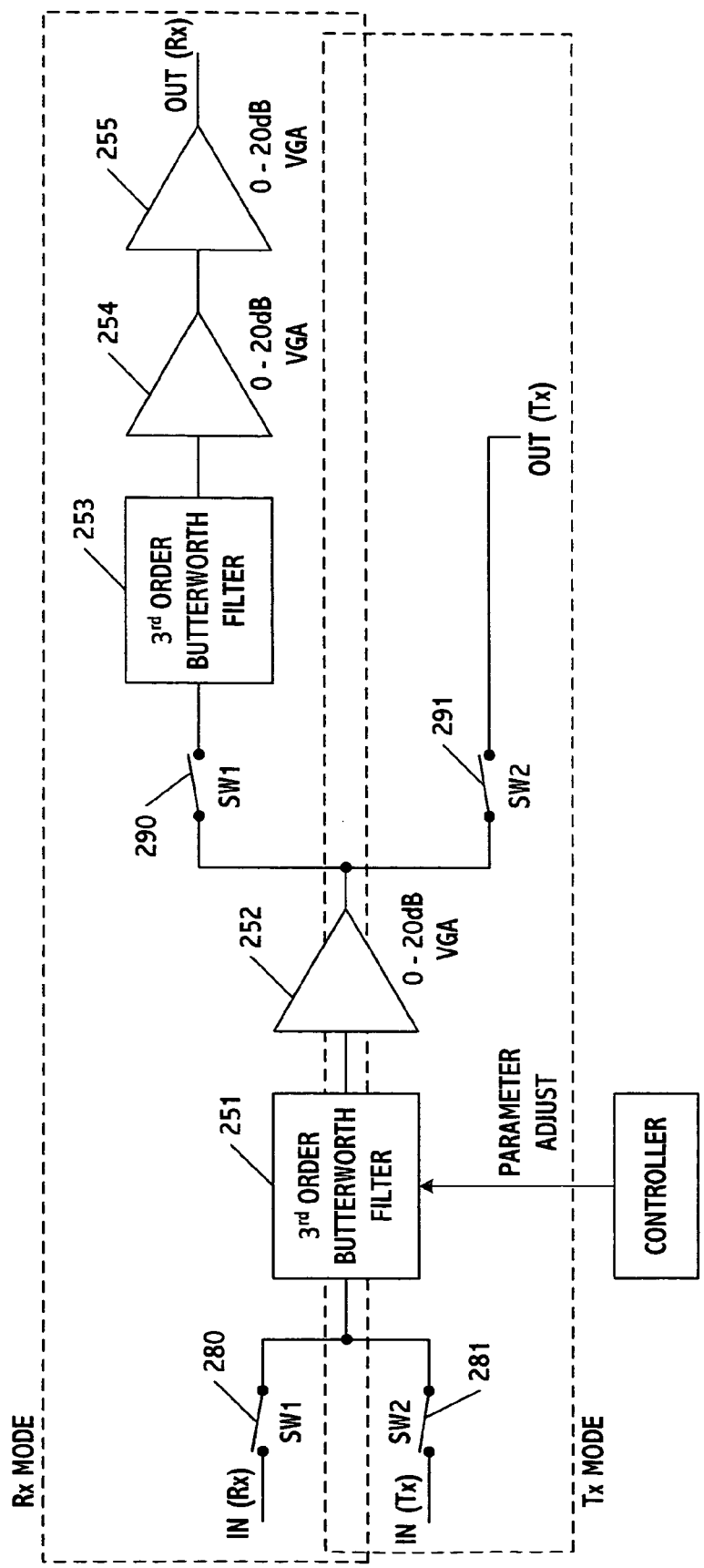
FIG. 13 is a diagram showing a control system for re-configuring the filter shown in FIGS. 12(a) and 12(b).

FIG. 13 shows a controller 270 which switches the filter between its receiver-mode and transmitter-mode configurations in synchronism with switches 280, 281 and 290, 191, which are respectively connected to input and output terminals In(Rx), In(Tx), Out(Rx), and Out(Tx). In receiver mode, switches 280 and 290 close to configure the filter as shown in FIG. 12(a). The controller then generates control signals to set one or more parameters of Butterworth filter 251 to achieve a frequency characteristic desired for receiver operation. In transmitter mode, switches 281 and 291 close to configure the filter as shown in FIG. 12(b). The controller then generates control signals to set one or more parameters of Butterworth filter 251 to achieve a frequency characteristic desired for transmitter operation. The parameters of Butterworth filter 253 and amplifiers 254 and 255 may be set to fixed values, or controller 270 may also generate control signals for setting these parameters to achieve the desired characteristic. Also, if desired, the controller may operate the switches of the input and output terminals.

By re-configuring a single filter to handle multiple operational modes of a transceiver, a significantly faster and more efficient circuit is realized compared with other filter designs. In transmit mode, much of the hardware related to the receive mode is turned off and not used. The initial filter and amplifier, however, are retained. In receiver mode, these same elements are re-used and connected to additional hardware. The present invention therefore re-uses many of the functional building blocks of the filter for different modes of operation, thereby reducing hardware requirements and increasing signal processing speed.

The foregoing embodiments of the present invention may be varied in any one of a variety of ways. For example, the location of the filter of the present invention may be varied along the transmitter and receiver paths of the transceiver. For example, along the receiver path, the input of the filter may be connected to the output of a variable-gain amplifier or a down-conversion mixer and the output of the filter may be connected to the input of another variable gain amplifier or the input of another filter. Along the transmitter path, the input of the filter may be connected to the output of a digital-to-analog converter or the output a variable-gain amplifier and the output of the filter may be connected to the input of another filter, the input of an up-conversion mixer, or the input of a variable-gain amplifier. As previously mentioned, in a preferred application all of the foregoing elements are situated in the front-end portion of the transceiver.

Also, in the foregoing embodiments a single controller has been shown to generate the signals for controlling the connectors and processing block (the single-filter or the filters-amplifier design) of the present invention. If desired, separate controllers or processing elements may be used to generate the processing block and connector signals.

Also, while the invention is particularly well suited to filtering signals in a time-multiplexed system, those skilled in the art can appreciate that the invention may be applied to filter signals in transceivers which operate according to other communication techniques.

Also, while switching between only two modes of operation has been discussed above, the present invention may be adapted through its controller and appropriate switches to reconfigure a single filter to handle three or more modes of operation.

Also, while the filter of the present invention has been described as being implemented in a transceiver, those skilled in the art can appreciate that the invention is not to be limited to this specific application. Rather, the embodiments of the present invention may be applied to any multi-mode system where signal filtering is required.

In summary, conventional transceivers such as those performing time-multiplexed or half-duplex applications use separate baseband filters for processing transmitter and receiver signals. This has the undesirable effect of increasing costs along with the chip area needed to implement the circuit. By a sharing a filter between the transmitter and receiver paths, the present invention advantageously reduces the amount of hardware required to implement its transceiver. This comes at virtually no overhead as the cost of the connectors is virtually negligible, and no substantial delays are added to signal processing time by introduction of the connectors. Also, through the present invention the large active devices and passive components (e.g., capacitor and resistors) used to construct the baseband filters along the signal paths of conventional receivers are reduced or eliminated. As a result, the chip area needed to implement the transceiver may be substantially reduced, e.g., almost 50% compared with conventional transceiver topology.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention.

We claim:

1. A transceiver, comprising:
   a filter;
   a connector which selectively connects the filter to a transmitter path and a receiver path; and
   a controller which generates a first signal for selectively connecting the filter to one of the transmitter path and receiver path through the connector, a second signal for setting at least one parameter of the filter based on whether the filter is connected to the transmitter path or the receiver path, a third signal for setting a gain of an amplifier coupled to the filter based on whether the filter is connected to the transmitter path or the receiver path; and a fourth signal for setting at least one parameter of another filter coupled to the amplifier and filter based on whether the filter is connected to the transmitter path or the receiver path.

2. The transceiver of claim 1, wherein said at least one parameter of the filter is at least one of cut-off frequency, gain, group delay, and stop-band attenuation.

3. The transceiver of claim 1, wherein the controller generates a mode signal indicative of a mode of operation of the transceiver, and wherein the connector connects the filter to one of the transmitter path and the receiver path based on said mode signal.

4. The transceiver of claim 3, wherein the controller connects the filter to the transmitter path when said mode signal is indicative of a transmitter mode of operation and connects the filter to the receiver path when said mode signal is indicative of a receiver mode of operation.

5. The transceiver of claim 3, wherein the controller sets said at least one parameter of the filter based on the mode of operation of the transceiver.

6. The transceiver of claim 5, wherein the controller sets said at least one parameter of the filter based on whether the transceiver is operating in a transmitter mode or a receiver mode.

7. The transceiver of claim 5, wherein said at least one parameter of the filter is at least one of cut-off frequency, gain, group delay, and stop-band attenuation.

8. The transceiver of claim 5, wherein the controller includes a first control circuit which generates said mode signal indicative of a mode of operation of the transceiver and a second control circuit which sets said at least one parameter of the filter based on the mode of operation of the transceiver.

9. The transceiver of claim 6, wherein the controller sets the filter to a first cut-off frequency when the transceiver is operating in the transmitter mode and sets the filter to a second cut-off frequency when the transceiver is operating in the receiver mode.

10. The transceiver of claim 1, wherein the connector includes switching circuit for connecting the filter to the transmitter path and receiver path.

11. The transceiver of claim 1, wherein the connector connects the filter along a baseband signal recovery portion of the receiver path.

12. The transceiver of claim 11, wherein the baseband signal recovery portion recovers a baseband signal from a received signal based on only one down conversion.

13. The transceiver of claim 11, wherein the baseband signal recovery portion recovers a baseband signal from a received signal using only one mixer.

14. The transceiver of claim 1, wherein the transmitter path and receiver path have a direct-conversion architecture.

15. A system for operating a transceiver having a filter selectively coupled to transmitter and receiver paths, comprising:
    a controller which generates:
    a first signal for connecting the filter to the transmitter path or receiver path;
    a second signal for setting at least one parameter of the filter based on whether the filter is connected to the transmitter path or the receiver path,
    a third signal for setting a gain of an amplifier coupled to the filter based on whether the filter is connected to the transmitter path or the receiver path; and
    a fourth signal for setting at least one parameter of another filter coupled to the amplifier and filter based on whether the filter is connected to the transmitter path or the receiver path.

16. The system of claim 15, wherein the first signal is a selection signal for controlling a connector to connect the filter to one of the transmitter and receiver paths based on a mode of operation of the transceiver.

17. The system of claim 16, wherein the selection signal controls the connector to connect the filter to the transmitter path when the transceiver is operating in transmitter mode, and wherein the selection signal controls the connector to connect the filter to the receiver path when the transceiver is operating in receiver mode.

18. The system of claim 16, wherein the connector includes at least one switch for connecting the filter to the transmitter path and receiver path.

19. The system of claim 15, wherein said at least one parameter of the filter is at least one of cut-off frequency, gain, group delay, and stop-band attenuation.

20. A method for controlling signal filtering in a transceiver, comprising:
    generating a first signal for selectively connecting a filter to a transmitter path and a receiver path;
    generating a second signal for setting at least one parameter of the filter based on whether the filter is connected to the transmitter path or the receiver path;
    generating a third signal for setting a gain of an amplifier coupled to the filter based on whether the filter is connected to the transmitter path or the receiver path; and
    generating a fourth signal for setting at least one parameter of another filter coupled to the amplifier and filter based on whether the filter is connected to the transmitter path or the receiver path.

21. The method of claim 20, wherein generating the first signal includes:

determining a mode of operation of the transceiver; and
generating the first signal based on the mode of operation.

22. The method of claim 21, wherein the first signal is generated to connect the filter to the transmitter path when the transceiver is determined to operate in transmitter mode, and wherein the first signal is generated to connect the filter to the receiver path when the transceiver is determined to operate in receiver mode.

23. The method of claim 20, wherein said at least one parameter of the filter is at least one of cut-off frequency, gain, group delay, and stop-band attenuation.

24. The method of claim 20, wherein the filter is located along a baseband signal recovery portion of the receiver path.

25. The method of claim 20, wherein the transceiver is a direct-conversion transceiver.

26. A method for filtering signals in a transceiver, comprising:
selectively connecting a filter to a transmitter path and a receiver path;
setting at least one parameter of the filter based on whether the filter is connected to the transmitter path or the receiver path;
setting a gain of an amplifier coupled to the filter based on whether the filter is connected to the transmitter path or the receiver path; and
setting at least one parameter of another filter coupled to the amplifier and the filter based on whether the filter is connected to the transmitter path or the receiver path.

27. The method of claim 26, further comprising:
determining a mode of operation of the transceiver, wherein the connecting and setting steps are performed based on the mode of operation.

28. The method of claim 27, wherein the connecting step includes connecting the filter to the transmitter path when the transceiver is in transmitter mode and connecting the filter to the receiver path when the transceiver is in receiver mode.

29. The method of claim 26, wherein said at least one parameter of the filter is at least one of cut-off frequency, gain, group delay, and stop-band attenuation.

30. The method of claim 26, wherein the filter is located in a baseband signal recovery portion of the transceiver.

31. The method of claim 26, wherein the transceiver has a direct-conversion architecture.

* * * * *